(12) United States Patent
Loibl et al.

(10) Patent No.: US 8,111,527 B2
(45) Date of Patent: Feb. 7, 2012

(54) STANDARDIZED SUPPORT ELEMENT WITH INTEGRATED INTERFACE

(75) Inventors: Josef Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 280 days.

(21) Appl. No.: 12/597,194

(22) PCT Filed: Mar. 4, 2008

(86) PCT No.: PCT/EP2008/052592
§ 371 (c)(1),
(2), (4) Date: Oct. 23, 2009

(87) PCT Pub. No.: WO2008/128815
PCT Pub. Date: Oct. 30, 2008

(65) Prior Publication Data
US 2010/0128459 A1    May 27, 2010

(30) Foreign Application Priority Data
Apr. 23, 2007   (DE) .......................... 10 2007 019 095

(51) Int. Cl.
*H05K 7/00* (2006.01)

(52) U.S. Cl. ........... 361/829; 310/348; 700/79; 177/548

(58) Field of Classification Search .................. 310/348, 310/344, 330, 370; 361/679.26, 760, 829, 361/702, 312.1, 782, 699, 810, 807; 700/56, 700/79, 97; 174/252, 521, 261, 260, 548, 174/255, 524; 360/73.01, 98.01, 125.33, 360/97.01
See application file for complete search history.

(56) References Cited

U.S. PATENT DOCUMENTS

| | | | |
|---|---|---|---|
| 5,385,271 A | 1/1995 | Bierend et al. | |
| 5,568,357 A * | 10/1996 | Kochis et al. | 361/679.26 |
| 6,269,834 B1 | 8/2001 | Huhnen | |
| 7,032,325 B2 | 4/2006 | Walker | |
| 7,751,918 B2 * | 7/2010 | Campbell et al. | 700/97 |
| 2002/0036448 A1 * | 3/2002 | Kageyama et al. | 310/348 |
| 2009/0053943 A1 | 2/2009 | Fink et al. | |

FOREIGN PATENT DOCUMENTS

| | | |
|---|---|---|
| DE | 10310235 A1 | 9/2004 |
| DE | 102004015620 A1 | 3/2005 |
| DE | 102004050687 A1 | 4/2006 |
| DE | 19901880 B4 | 12/2006 |
| EP | 1731395 A1 | 12/2006 |
| WO | 9503244 A1 | 2/1995 |

* cited by examiner

*Primary Examiner* — Hung Duong
(74) *Attorney, Agent, or Firm* — Laurence A. Greenberg; Werner H. Stemer; Ralph E. Locher

(57) ABSTRACT

A support element for an electronic control device includes receivers for peripheral electronic components and at least one path region for guiding electrical connections. The electrical connections lead to an integrated standardized interface for connection to central control electronics.

10 Claims, 2 Drawing Sheets

STANDARDIZED SUPPORT ELEMENT WITH INTEGRATED INTERFACE

BACKGROUND OF THE INVENTION

1. Field of the Invention

The invention relates to a standardized support element according to the preamble of claim 1 as well as to an electronic control unit having such a support element, in particular for transmission- or engine control systems in the automotive industry.

2. Prior Art

In automotive engineering components such as transmission-, engine- or brake systems are increasingly controlled mainly electronically. Here, there is a trend towards mechatronic control systems, i.e. the integration of control electronics and the associated electronic components, such as sensors or valves, in the transmission, the engine, the brake system or the like. The control units generally comprise a large number of electronic components that are connected to other components outside of the control unit. In the case of such integrated electronics, these control systems are no longer accommodated in a separate, specially protected electronics compartment. For this reason, they have to withstand corresponding environmental influences as well as mechanical, thermal and chemical stress.

For this purpose they are normally installed in special hermetically sealed housings. The housings moreover perform an important screening function. To enable a reliable connection to components situated outside the housing, an electrical connection from the housing interior to the housing exterior and to the peripheral components is required. Systems are known, in which the central electronics in the housing are electrically contacted to an all-component support. The all-component support represents a made-to-measure connection of all of the components situated outside the control unit to the central electronics. This arrangement does however consequently have the drawback that a flexible connection of individual peripheral components to the central electronics is not possible. Furthermore, the all-component support has to be specifically redeveloped and redesigned for the respective application and the specific requirements associated therewith. This involves a considerable expenditure of time and money.

A design for achieving flexibility of the connection between peripheral components and central electronics is known from DE 10 2004 050 689 A1. This discloses an arrangement for the electrical connection of control electronics to peripheral components such as for example sensors, valves or plug-in connectors by means of a plug-in system comprising a cable channel and float-mounted mating connectors for the components at the other end of the cable.

As an example of a generic contacting of cable ends to a flexible printed-circuit board reference is made to DE 10 2004 050 687 A1. This discloses a facility for the direct contacting of a cable or a cable bundle, which is attached to a flexible printed-circuit board, and in this way peripheral components may be connected to the central control electronics.

Here too, however, there is in each case the drawback that for each control unit it is necessary to produce a layout for the housing and the geometry of the flexible printed-circuit boards that is individually adapted and tuned to the relevant components. A modification of the specifications for contacting the peripheral components or even of the size and geometry of the central electronics substrate inevitably also entails having to find and manufacture a new layout for the connection of the components, the housing and the flexible printed-circuit boards. This necessity exists independently of whether the flexible printed-circuit boards are of an integral construction or take the form of partial components.

BRIEF SUMMARY OF THE INVENTION

Object of the Invention

The object of the invention is therefore to provide a standardized support element that enables a simple, reliable and flexible electrical connection of functional peripheral components, such as valves, sensors, satellites and external plug-in connectors. At the same time, a design for a standardized, in particular for a modular, connection of peripheral components to central electronics is to be made available.

This object is achieved according to the invention by a support element having receivers for peripheral electronic components and at least one path region for the running of electrical connections as well as by an electronic control unit comprising one or more support elements according to the invention.

According to the invention it is proposed that the support element comprises an electronic connection with uniform interface for components disposed outside the central electronics that is connectable at least partially to the contact partners of the printed-circuit board of the central electronics. At the same time, the support element comprises at least one receiver for one or more peripheral components. Thus, the support element according to the invention combines the two different functions of secure location and standardized contacting that have up till now been performed by separate structural parts. Furthermore, with this combination of functionalities it is also possible to realize a standardization of the contacting with central electronics of integrated mechatronics. It is therefore possible for the first time to provide a preset modular interface for identical or different peripheral components. It is thereby possible to achieve not only an optimum routing of the signal- and current paths but also easy and flexible adaptation to different arrangements, functionalities and geometries of the peripheral components, such as valves, sensors, satellites or the like.

Further advantageous refinements and developments that may be used individually or in combination with one another are the subject matter of the dependent claims.

In a preferred refinement of the invention, a support element may comprise one or more integrated electrical connections to one or more peripheral components. The integrated connections may preferably take the form of cables, printed conductors, punched grids or plug-in connectors.

Thus, the layout of the support element may be tailored to the respective type of peripheral component, in relation to which a connection to the central electronics is to be established. Equally, a plurality of identical or different peripheral components may be fitted into the support element and connected to the central electronics. According to the invention a modular system for various arrangements of peripheral components is therefore possible, which allows considerable flexibility of the housing construction and at the same time, because of the standardized manufacture, a considerable reduction in cost.

In a further preferred manner, the support element may simultaneously comprise a path region for one or more electrical connections. In addition to structural support of the electric lines, this has the advantage of allowing a further shortening and routing of the signal- and current paths. In addition, by virtue of this compact combination and design of the electronics, on the one hand, and of the peripheral components connected thereto, on the other hand, the susceptibility to faults and interference is markedly reduced.

In another preferred refinement of the invention, the support element may provide additional covers for the electrical connections, which covers serve as protection against chips and further contamination by environmental influences. In an advantageous manner this allows the use of for example open printed conductor regions as electrical connections, which are completely covered both in the path region in the supply cable to the individual peripheral components and in the region of the standardized interface with the central electronics. It is therefore possible to replace any contacting covers that would otherwise be required.

The connections between the peripheral electronic components to the preferably standardized interface and the central electronics of the present invention may be established in any known manner. Preferably a direct contacting of the electrical connections integrated in the support element with the corresponding regions of the printed-circuit board of the central electronics is effected via the standardized interface without further plug-in connectors or mating connectors. In this way, both a cost reduction and a reduced susceptibility to faults may be achieved. Quality inspection is moreover facilitated because of the standardized construction.

In the electronically controlled systems according to the invention, as a connection to the central electronics preferably flexible printed-circuit boards are used. These are particularly suitable for use in the case of high mechanical and thermal requirements, such as arise also in the field of engine- and transmission control systems in motor vehicles. Their flexible design allows easy adaptability to different electrical components and/or control electronics. According to the invention the connection may also be a multi-layer flexible printed-circuit board, which by definition comprises two or more printed conductor planes that are separated by insulating layers.

The flexible printed-circuit board may comprise for example a bottom polyimide base foil, on which are disposed metal, preferably copper, printed conductors embedded in an adhesive layer as well as a polyimide cover foil. Further, preferably less expensive materials may alternatively be used both for the base foil and for the adhesive layer. It is therefore possible for example to reduce costs by providing materials that may be applied using a spraying, painting or screen printing method. It is additionally possible to vary the layer thickness of the individual layers.

To protect the central electronics, a housing lid may be provided for example with a seal or a sealing material. Alternatively or additionally the housing lid may be connected also by riveting, gluing or soldering to the base plate and/or the flexible printed-circuit board of the central electronics. The important point here is above all to guarantee efficient sealing, should the electronic components subsequently be installed in an aggressive environment, such as for example in a transmission or in an engine. If the housing lid is fastened by means of soldering, then a continuous circumferential metal track is first disposed on the surface [of the] flexible printed-circuit board. This metal region preferably forms the seating surface of the housing lid. The housing lid may be made of any material that guarantees an adequate protection of the electronics against the prevailing environmental influences. In addition to housing lids made of plastics material, housing lids made of metal materials may also be used. If the aim is to fasten the housing lid by means of soldering, a housing lid made of metal should preferably be provided. This simultaneously offers the required EMC screening values and increased rigidity.

The support element is made in a preferred manner from a non-metal material, in a particularly preferred manner it takes the form of a plastic injection-molded part or molded-plastic part. In this way a complex architecture of the support element with receivers and latching devices for the peripheral components and for the regions, in which the electrical connections are run, may be realized.

In a preferred embodiment of the invention, a flexible printed-circuit board may be laminated onto the corresponding region of the support element. This ensures a reliable, light and inexpensive electrical connection.

To manufacture a support element according to the invention for a control unit, a molded-plastic part is manufactured and equipped with the desired peripheral components such as valves or sensors. The peripheral components are then electrically connected preferably by an integral flexible printed-circuit board or by one or more cables to the standardized interface, which is likewise disposed in the support element according to the invention. The contacting with the electronic components of the central electronics is established via the interface and then the optionally provided covers are mounted and fastened onto the corresponding regions of the electronic connection. Thus, the electrical connections along the support element and the interface are protected against external environmental influences. Such external influences may include for example metal chips, which are residues from manufacture of the transmission- or engine housing and could lead to shorting of the contacting or of the optionally open regions of the copper printed conductors.

The invention further comprises an electronic control unit that comprises one or more support elements according to the preceding description. A control unit according to the invention may, because of the new support elements, be manufactured in a simplified modular and more compact design and is less susceptible to faults than the previous control units.

The control unit may be provided for example for an integrated mechatronic control system of the transmission or engine of a motor vehicle.

BRIEF DESCRIPTION OF THE SEVERAL VIEWS OF THE DRAWING

The invention is described below with reference to the drawings by way of the example of a construction variant, without being restricted thereto.

The drawings show.

DESCRIPTION OF THE INVENTION

Figure 1:
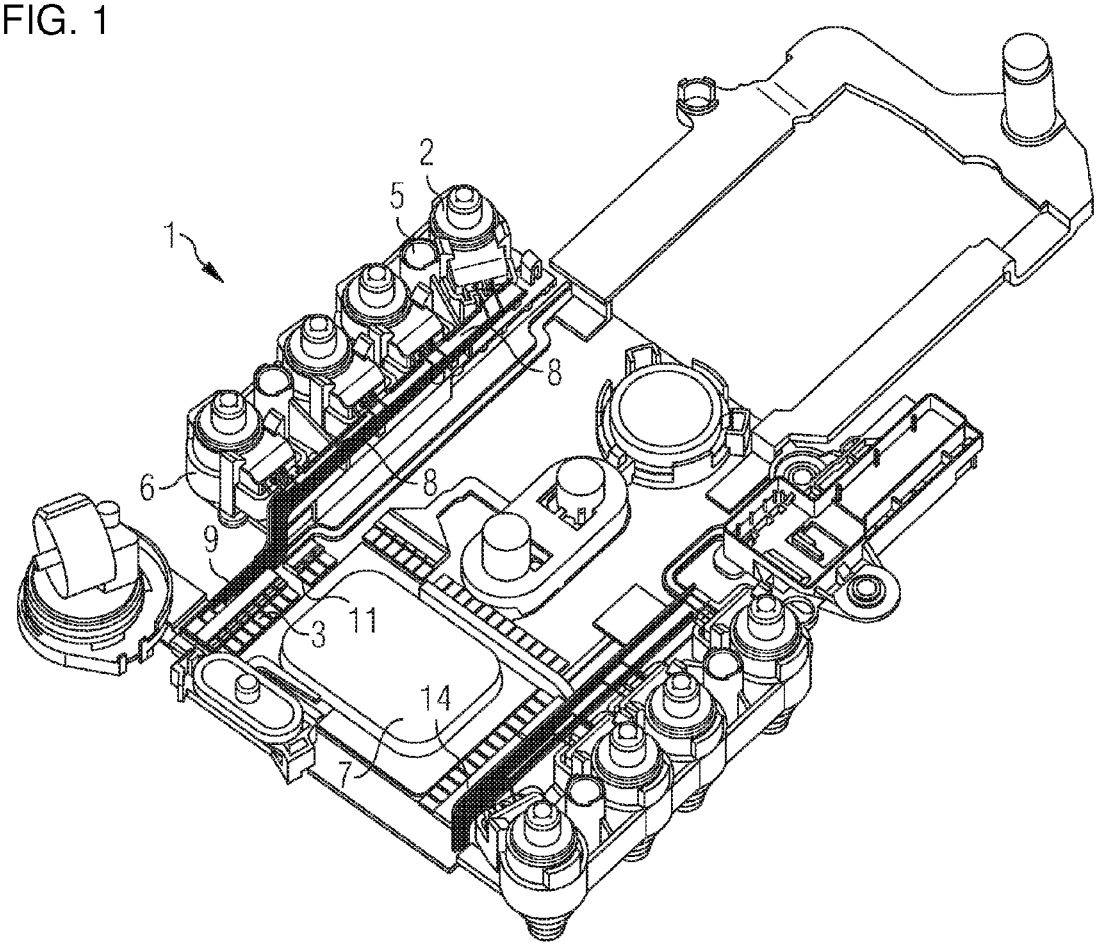
FIG. 1 a perspective plan view of the support element, in which four peripheral components are fitted and which is connected to a closed central electronics housing by a standardized interface, and FIG. 2 a perspective plan view as a detail view of the support element in FIG. 1.

FIG. 1 shows a support element 1 according to the invention that is provided for the modular connection of peripheral components 2 by a standardized interface 3 to central control electronics 7 that are to be fitted in a motor vehicle transmission. The support element 1 is formed by a complex molded-plastic part 5 having receivers 6 for the individual peripheral components 2 and having a path region 8 for receiving and supporting the electrical connection 9 as far as the integrated interface 3 for the central electronics 7. On the path region 8 a flexible printed-circuit board is fastened as an electrical connection. The support element 1 according to the invention and the integrated standardized interface 3 are each connected in such a way to the central electronics 7 that a connection and electrical contacting with the open copper zones of the flexible printed-circuit board 11 is established. In an advantageous manner, the design and connection of the interface 3 is adapted in such a way that open printed conductor regions of the flexible printed-circuit board 11 may be covered completely and at least in a chip-proof manner. It is therefore possible to dispense with an additional contacting cover above the printed-circuit board 11. Additional contacting covers (not represented) may optionally be provided for protecting against chips and against other environmental influences.

Figure 2:
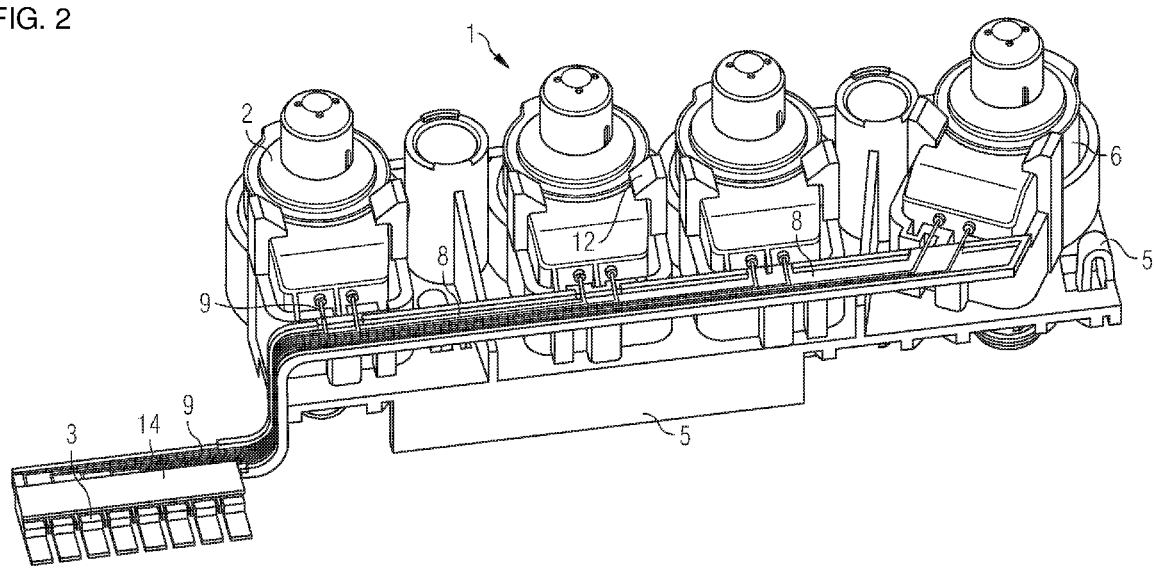

FIG. 2 shows an enlarged view of the support element of FIG. 1. For secure seating of the peripheral components 2, besides the receivers 6 of a form-fit design latching devices 12 are additionally provided. In the figure the individual electrical connections 9 are disposed in the path region 8 of the support element in such a way that an optimum routing of the signal- and current paths is achieved. The standardized interface 3 for connection to the printed conductor regions of the central electronics additionally comprises a cover 14. In this way, it is possible extensively to dispense with individual contacting covers.

The invention claimed is:

1. A support element, comprising:
peripheral electronic components;
receivers for said peripheral electronic components;
at least one path region;
central control electronics;
an integrated standardized interface; and
electrical connections guided by said at least one path region and leading into said integrated standardized interface for connection to said central control electronics.

2. The support element according to claim 1, wherein the support element is a plastic injection-molded part or a molded-plastic part.

3. The support element according to claim 1, which further comprises a plurality of identical or different peripheral components.

4. The support element according to claim 3, wherein said peripheral components are valves.

5. The support element according to claim 1, wherein said electronic connections include a multisection cable or a flexible printed-circuit board.

6. The support element according to claim 5, wherein said flexible printed-circuit board has open printed conductor regions.

7. The support element according to claim 1, wherein said electronic connections have a cover.

8. The support element according to claim 1, wherein said integrated standardized interface includes a cover for points of contact with said central electronics.

9. An electronic control unit, comprising:
at least one support element according to claim 1.

10. An integrated mechatronic transmission control system of a motor vehicle, the control system comprising:
a support element according to claim 1.

* * * * *